(12) United States Patent
Yamada et al.

(10) Patent No.: US 7,149,271 B2
(45) Date of Patent: Dec. 12, 2006

(54) DRIVER DRIVING METHOD, DRIVER CIRCUIT, TRANSMISSION METHOD USING DRIVER, AND CONTROL CIRCUIT

(75) Inventors: Jun Yamada, Kawasaki (JP); Yutaka Mori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/944,733

(22) Filed: Sep. 21, 2004

(65) Prior Publication Data
US 2005/0035780 A1 Feb. 17, 2005

Related U.S. Application Data

(63) Continuation of application No. PCT/JP02/03230, filed on Mar. 29, 2002.

(51) Int. Cl.
*H03K 19/003* (2006.01)

(52) U.S. Cl. ................. 376/30; 326/26; 326/87

(58) Field of Classification Search ........... 326/26–28, 326/30, 87; 327/108, 112
See application file for complete search history.

(56) References Cited

U.S. PATENT DOCUMENTS

| | | | |
|---|---|---|---|
| 6,066,958 A * | 5/2000 | Taniguchi et al. | 326/27 |
| 6,166,971 A | 12/2000 | Tamura et al. | |
| 6,225,844 B1 * | 5/2001 | Fujiwara | 327/170 |
| 6,400,616 B1 | 6/2002 | Tamura et al. | |
| 6,707,727 B1 | 3/2004 | Tamura et al. | |
| 6,772,250 B1 * | 8/2004 | Dreps et al. | 710/100 |
| 2002/0084800 A1 * | 7/2002 | Crittenden et al. | 326/30 |
| 2002/0186056 A1 * | 12/2002 | Jong et al. | 327/108 |

FOREIGN PATENT DOCUMENTS

| | | |
|---|---|---|
| EP | 0 963 083 A2 | 12/1999 |
| JP | 06-152372 | 5/1994 |
| JP | 09-162719 | 6/1997 |
| JP | 11-239049 | 8/1999 |
| JP | 11345054 A | 12/1999 |
| JP | 2000196418 A | 7/2000 |
| JP | 2000196680 A | 7/2000 |
| JP | 2000196681 A | 7/2000 |
| JP | 2002-094365 | 3/2002 |

* cited by examiner

*Primary Examiner*—Anh Q. Tran
(74) *Attorney, Agent, or Firm*—Arent Fox PLLC (57) ABSTRACT

A driver circuit 10 comprising a driver unit 30 and a driver control unit 20 for controlling a driver by comparing present data of an input signal with previous data, wherein the driver unit 30 includes a plurality of parallel drivers, and the driver control unit 20 compares the present data of the input signal with data one cycle back and, if they are not identical, causes the plurality of parallel drivers to operate, thereby increasing the driving power of the driver. The driver control unit 20 further compares the present data with data two cycles back and, if they are identical, can reduce the factor by which to increase the driving power by not causing a selected one or ones of the plurality of parallel drivers to operate.

7 Claims, 8 Drawing Sheets

DRIVER DRIVING METHOD, DRIVER CIRCUIT, TRANSMISSION METHOD USING DRIVER, AND CONTROL CIRCUIT

CROSS-REFERENCE TO RELATED APPLICATION

This application is a continuation application and is based upon PCT/JP02/03230, filed on Mar. 29, 2002.

TECHNICAL FIELD

The present invention relates to signal transmission techniques using a driver and a receiver and, more particularly, to signal transmission techniques which may be advantageously applied, for example, to the transmission of high-frequency signals between LSIs used in a computer.

BACKGROUND ART

Recent computer-related technology has seen a dramatic improvement in signal processing speed. With this trend, the transmitting frequency of signals between circuit components such as LSIs has been increased to higher than ever before. When the transmitting frequency is raised, if signals are transmitted over the same distance as before, signal transmission loss increases to a non-negligible level. For example, in the wiring on a board in a computer used as a server, as the operating frequency increases, the transmission loss of high-frequency components, due to the skin effect, etc., increases to an appreciable level, and the sharpness of signal edges is lost, reducing the initial level of the signal at the receiver end.

The reduction of the signal level at the receiver end results in reduced resistance to signal noise and a reduced timing margin.

To compensate for such transmission loss, the prior art proposes a transmission technique such as disclosed in Japanese Unexamined Publication No. 2000-19681.

Japanese Unexamined Publication No. 2000-19681 describes a circuit in which the input signal is delayed by one cycle through a delay circuit, inverted by an inverter circuit and then added to the original input signal to emphasize the portion where signal data changes. However, this circuit has had the problem that the power consumption increases because a short circuit condition occurs when the input signal and its inverted signal are added together.

DISCLOSURE OF THE INVENTION

To solve the above problem, the present invention provides a driver circuit and a driver driving method in which the input signal to the driver is compared with the signal one cycle back and, if they are not identical, the driving power of the driver is increased. According to the present invention, transmission loss can be compensated for by increasing the driving power of the driver for one cycle period starting from the rising or falling of the signal.

The present invention also provides a driver circuit and a driver driving method in which the input signal to the driver is compared with the signal one cycle back and, if they are not identical, the driving power of the driver is increased, and in which the signal input to the driver is further compared with the signal two cycles back and, if they are identical, the factor by which to increase the driving power is reduced for the one cycle concerned. According to the present invention, not only can the transmission loss be compensated for, but waveform perturbations, which may be caused when the driving power is increased, can also be suppressed.

The present invention also provides a control circuit which detects a change in the input signal to the driver circuit, and controls the driver circuit in accordance with the result of the detection.

The present invention further provides a transmission method for transmitting an output from the driver to a receiver by using the above-described driver circuit.

BRIEF DESCRIPTION OF THE DRAWINGS

The present invention will be described below with reference to the accompanying drawings, wherein.

BEST MODE FOR CARRYING OUT THE INVENTION

Figure 1:
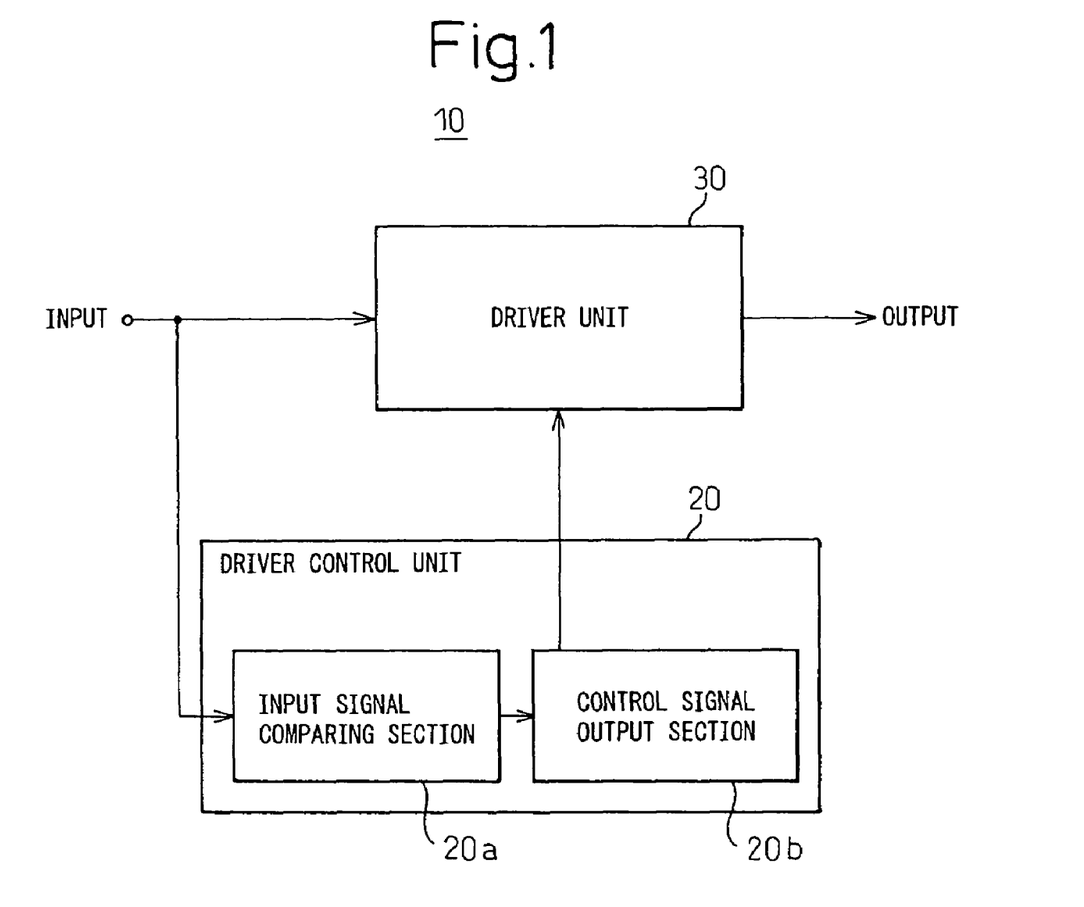
FIG. 1 is a diagram showing an overview of the present invention.

FIG. 1 shows an overview of the present invention.

A driver circuit 10 according to the present invention comprises a driver unit 30 and a driver control unit 20. The driver control unit 20 includes: a means for detecting a change in an input signal, or more specifically, an input signal comparing section 20a for comparing the present data of the input signal with its previous data; and a driver control signal output section 20b for outputting a signal for controlling the driver in accordance with the result of the comparison.

The driver control unit 20 compares the present data of the input signal with the data one cycle back and, if they are not identical, can output a control signal so as to increase the driving power of the driver.

In addition to that, the present data is compared with the data two cycles back, and if they are identical, the factor by which to increase the driving power of the driver can be reduced.

FIG. 2(a) shows a first embodiment of the present invention, and FIG. 2(b) shows a time chart for the same.

In FIG. 2(a), the driver circuit 10 having a driver input and a driver output is shown with a transmission line 5 and a receiver 6.

The driver unit 30 in the driver circuit 10 comprises two parallel drivers 31 and 32 connected in parallel. The driver control unit 20 comprises a D-flip-flop 12 and an exclusive-NOR circuit ENOR 21. The ENOR 21 compares the current data A of the input signal with the data B one cycle back and, if they are not identical, outputs an enable signal -EN to drive the driver 32.

To describe more specifically, the driver input is supplied to a D-flip-flop FF 11. A D-flip-flop, which operates as each clock pulse is applied, has the function of holding data for one cycle. Therefore, the driver input is output from the FF 11 as the input signal data A after being delayed by one cycle. The data A is passed through a delay time adjusting device 4, and supplied as a signal OT to the drivers 31 and 32.

The data A is also supplied to a D-flip-flop FF 12, as well as to one input of the exclusive-NOR circuit ENOR 21. The FF 12 outputs the data B by delaying the input data A by one cycle, and the output data B is supplied to the other input of the ENOR 21.

The truth table for the ENOR 21 is shown below.

| A | B | −EN | |
|---|---|-----|---|
| 0 | 0 | 1 | |
| 0 | 1 | 0 | (Drives the parallel driver 32 to emphasize the output) |
| 1 | 0 | 0 | (Drives the parallel driver 32 to emphasize the output) |
| 1 | 1 | 1 | |

The exclusive NOR circuit outputs a 1 if the inputs match, and a 0 if the inputs do not match. When the data A and the data B do not match, the ENOR 21 sets the enable signal -EN to 0 to drive the parallel driver 32.

FIG. 2(b) shows the time chart for particular portions of FIG. 2(a). Each section divided by vertical lines indicates one cycle.

The data A is the current input data.

The data B is the signal produced by delaying the data A by one cycle.

The enable signal -EN is the driver control signal created by inputting the data A and data B to the ENOR 21. When A and B match, a 1 is output, and when they do not match, a 0 is output as shown in cycles (i) to (iv). The parallel driver 32 is driven by the output 0.

The slight delay of the enable signal -EN shown in the time chart is due to the presence of circuit elements such as the ENOR 21.

The signal OT is the signal input to the drivers 31 and 32. The signal OT is created by giving the data signal A a delay equal to the delay time of the enable signal -EN.

The driver output X indicates the driving power of the driver for the input signal OT; in cycles (i) to (iv), the parallel driver 32 is operated by the output 0 of the enable signal -EN, to increase the driving power to twice the normal level.

That is, the driving power is increased by two times for one cycle period from the rising or falling of the data A. If there is no change in the data in the next cycle, the driving power is reduced back to the normal level (unity).

In this way, the driver control unit including the ENOR 21 detects a signal change by referring to the signal one cycle back, and controls the driver so as to emphasize the one cycle where the change has occurred.

When the driving power of the driver is enhanced to increase the output as just described, if transmission loss occurs in the high frequency components of the signal during transmission through the transmission line 5 to the receiver 6, the level drop at the receiver 6 can be compensated for.

Figure 2:
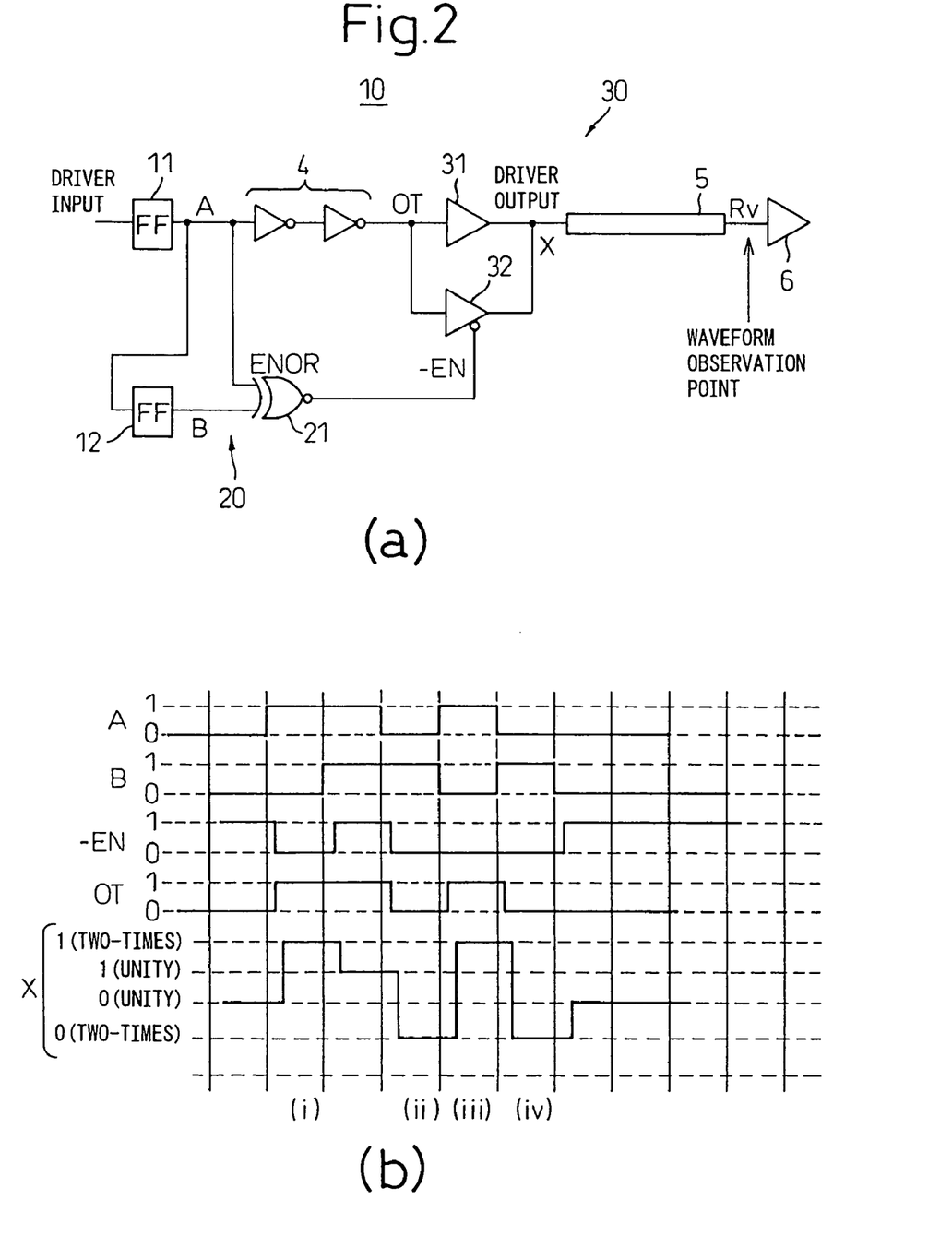
FIG. 2 is a diagram showing a first embodiment of the present invention.

As described above, according to the first embodiment, transmission loss can be compensated for by using a circuit with simple configuration.

In this embodiment, the driving power of the driver is doubled by connecting a plurality of drivers in parallel. Alternatively, a single driver having a high driving power may be used normally by limiting its power and, when needed, by increasing the driving power by an output signal of the driver control unit.

Here, for a better understanding of the advantageous effects of the present invention, a comparison will be made with a prior art driver loss compensating circuit.

FIG. 8(a) shows the prior art driver loss compensating circuit, and FIG. 8(b) shows a time chart for the same.

As shown in FIG. 8(a), in the prior art circuit, the input A is supplied to an amplifier 81 which produces an output X1; at the same time, the input A is also fed into a delay circuit 83 where a delay of one cycle is introduced, and the resulting signal is inverted by an inverter amplifier 82 to obtain an inverted output X2 with a desired level. Next, the outputs X1 and X2 are combined to obtain a driver output Y. As shown in the time chart of FIG. 8(b), the driver output Y has a waveform whose portion near the edge is emphasized for the time determined by one cycle.

Figure 8:
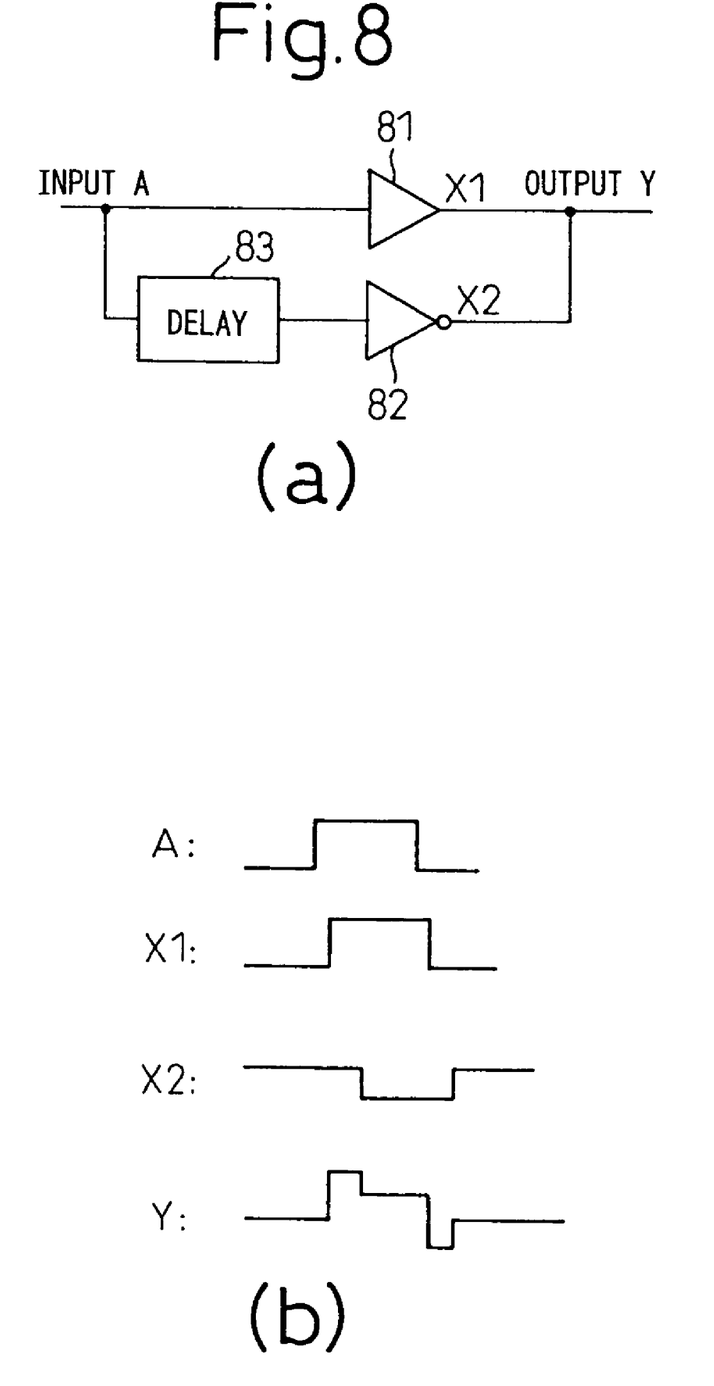
FIG. 8 is a diagram showing a prior art example.

The prior art is the same as the present invention in that the portion near the edge is emphasized, but differs in that the output X1 is directly summed with the inverted output X, as a result of which a short circuit condition occurs and the power loss increases. Furthermore, the level of the portions other than the portion near the edge is lower than the level of the original waveform.

In contrast, in the present invention, the output is emphasized by increasing the driving power of the driver; as a result, the short circuiting due to the signal summing does not occur, and the edge can be further emphasized compared with the prior art. Further, even if the power for emphasizing the signal is taken into account, the total power consumption can be reduced compared with the prior art.

Figure 3:
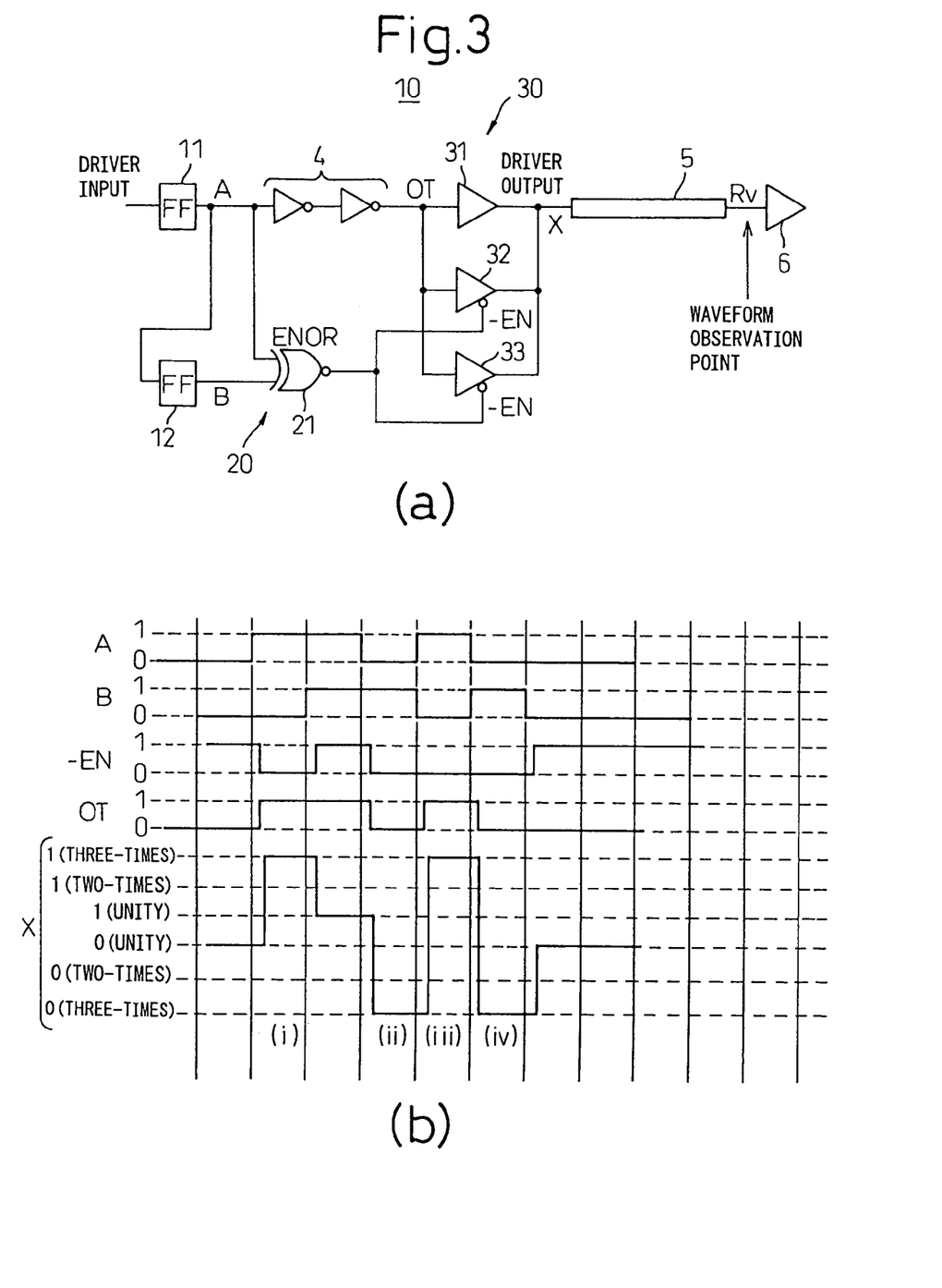
FIG. 3 is a diagram showing a second embodiment of the present invention.

FIG. 3(a) is a diagram showing a second embodiment of the present invention, and FIG. 3(b) is a time chart for the second embodiment. In FIG. 3, the same constituent elements as those in FIG. 2 are designated by the same reference numerals.

As shown in FIG. 3(a), the circuit configuration of the second embodiment differs from that of the first embodiment in that the driver unit in the second embodiment is constructed from three drivers 31, 32, and 33 connected in parallel, and in that not only the driver 32 but also the driver 33 is controlled by the driver control signal output from the ENOR 21.

FIG. 3(b) shows the time chart for the case where the present input signal data A, the same one as that shown in the first embodiment, is applied. The signals A and B, the enable signal -EN, and the signal OT are the same as those shown in the first embodiment. X indicates the driving power of the driver; here, since both the parallel drivers 32 and 33 are operated by the signal 0 of the enable signal -EN, the driving power is increased to three times the normal level as shown in cycles (i) to (iv).

That is, the driving power X of the driver is increased to three times the normal level for one cycle where a change has occurred. After that, the driving power is maintained at the normal level (unity) until a change occurs again.

In this way, when a data change is detected, not only the driver 32 but the driver 33 is also driven, thus providing the driver unit with a driving power of three times the normal level for only the one cycle where the change is detected.

This prevents the signal edge from rounding and the initial level of the signal from dropping, even when the signal is transmitted through the transmission line 5 with high transmission loss.

Here, the number of drivers connected in parallel need not necessarily be limited to three.

Figure 4:
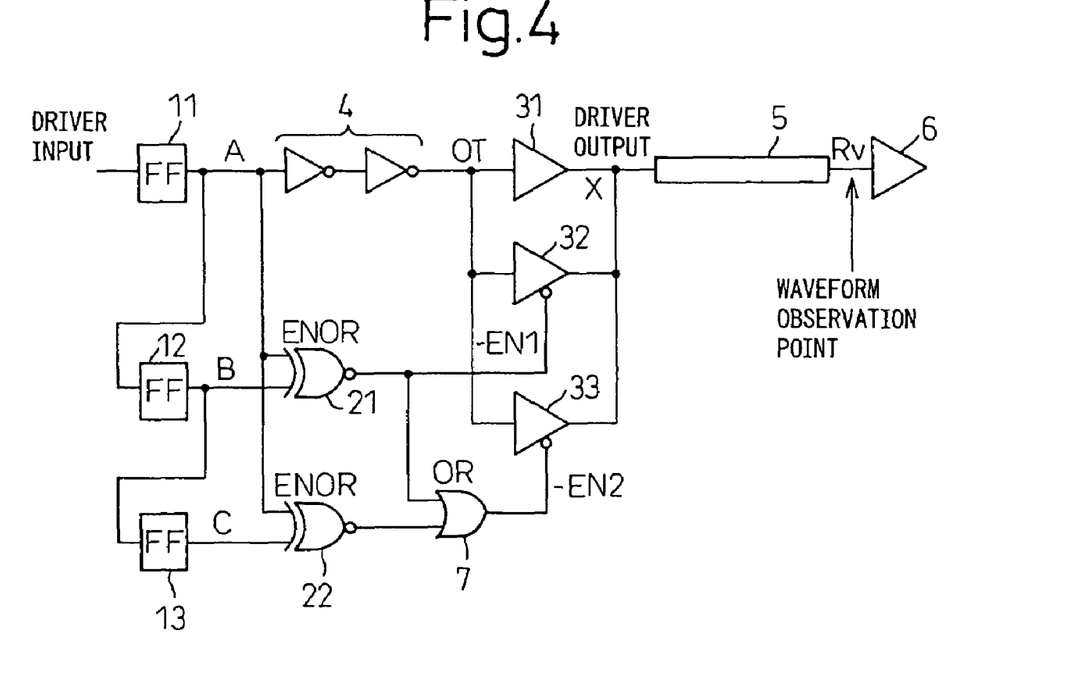
FIG. 4 is a diagram showing a third embodiment of the present invention.
Figure 5:
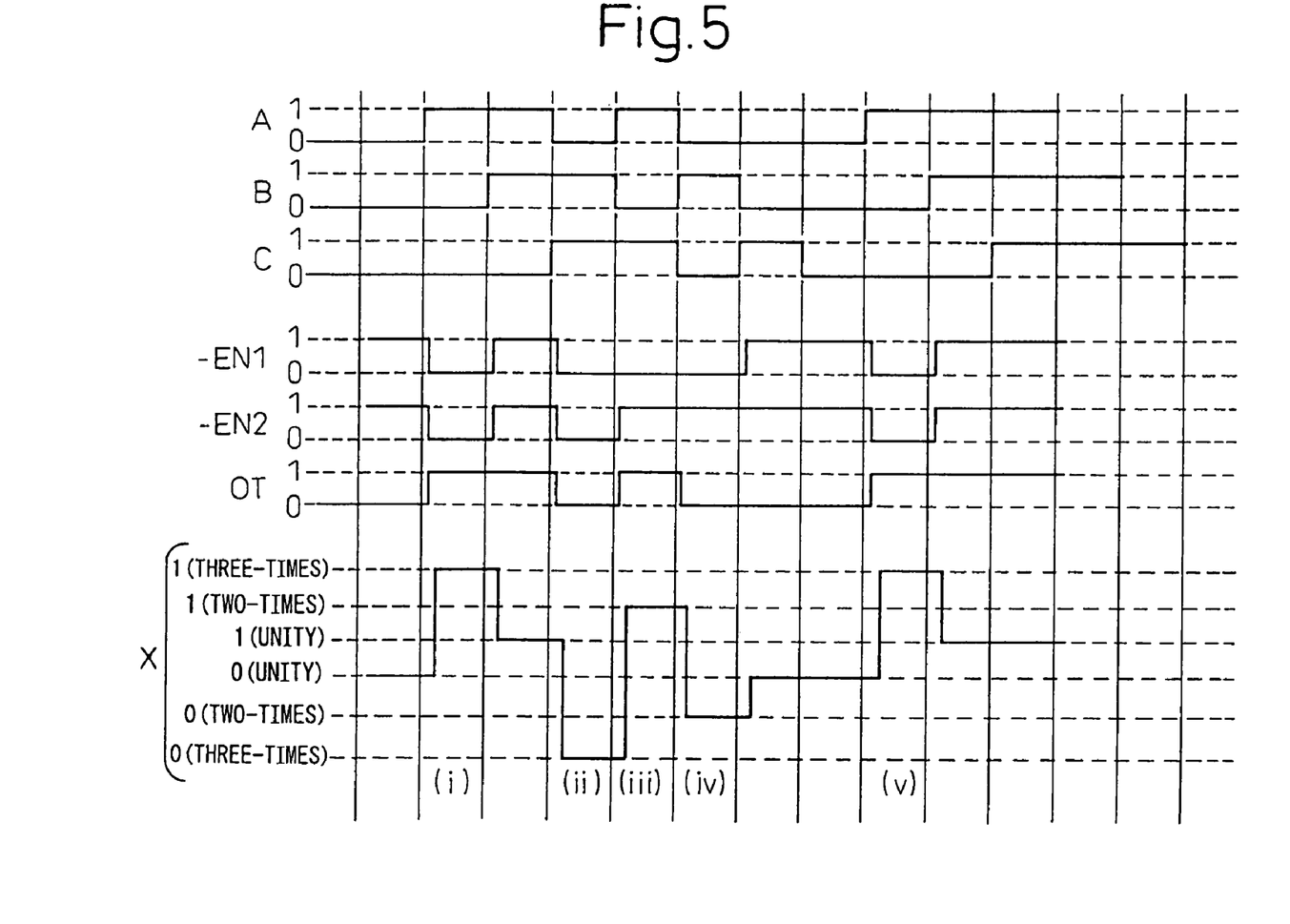
FIG. 5 is a time chart for the embodiment.

FIG. 4 is a diagram showing a third embodiment of the present invention, and FIG. 5 is a time chart for the third embodiment.

This embodiment includes three parallel drivers 31, 32, and 33, as in the second embodiment, but the control method differs. In the present embodiment, the third driver 33 is controlled by referring to the data two cycles back as well as to the data one cycle back. That is, in the second embodiment, whenever a change is detected, the driving power is increased by three times; on the other hand, in the present embodiment, the third driver 33 is not driven in certain cases, thus limiting the driving power to twice the normal level.

This serves to prevent perturbations in the waveform that may be caused when the driving power is increased by three times.

More specifically, to control the driver 33, another exclusive-NOR circuit ENOR 22 is provided in addition to the ENOR 21, and the driver 32 is controlled by an enable signal -EN2 which is the OR of the outputs of the ENORs 21 and 22.

The ENOR 22 takes the data A and data C at its inputs. The data C is a signal obtained as an output of a D-flip-flop FF 13 to which the data B is input. Since the data B is a signal obtained by delaying the data A by one cycle, it follows that the data C is a signal obtained by delaying the data A by two cycles.

The truth table for the enable signals -EN1 and -EN2 is shown below.

ENOR(A,B) indicates the exclusive NOR of A and B, and ENOR(A,C) indicates the exclusive NOR of A and C. The enable signal -EN1 is ENOR(A,B), while the enable signal -EN2 is the OR of ENOR(A,B) and ENOR(A,C).

| A | B | C | ENOR(A, B) | ENOR(A, C) | -EN1 | -EN2 |
|---|---|---|---|---|---|---|
| 0 | 0 | 0 | 1 | 1 | 1 | 1 |
| 0 | 0 | 1 | 1 | 0 | 1 | 1 |
| 0 | 1 | 0 | 0 | 1 | 0 | 1 (*2) |
| 0 | 1 | 1 | 0 | 0 | 0 | 0 (*1) |
| 1 | 0 | 0 | 0 | 0 | 0 | 0 (*1) |
| 1 | 0 | 1 | 0 | 1 | 0 | 1 (*2) |
| 1 | 1 | 0 | 1 | 0 | 1 | 1 |
| 1 | 1 | 1 | 1 | 1 | 1 | 1 |

(*1) indicates the case where both of the parallel drivers 32 and 33 are driven, thus increasing the driving power by three times to emphasize the output accordingly, while
(*2) indicates the case where the parallel driver 32 is driven but the parallel driver 33 is not driven, thus limiting the driving power to twice the normal level.

In the case (*2), the data A differs from the data B one cycle back, so that the enable signal -EN is 0; in the second embodiment, the driving power would be increased by three times as in the case (*1). In the third embodiment, however, the driving power is limited to twice the normal level, as described above.

Referring to the time chart shown in FIG. 5, the signals A and B, the enable signal -EN, and the signal OT are the same as those shown in the first and second embodiments, except that the data in the subsequent cycles omitted in the first and second embodiments are shown here.

The driving power X of the driver will be described below for each of the cycles where the input signal changes.

In each of the cycles (i), (ii), and (v), as the enable signals -EN1 and -EN2 are both 0, both of the parallel driver 32 and 33 are driven, increasing the driving power to three times the normal level as in the case of the second embodiment.

In each of the cycles (i), (ii), and (v), the present data OT does not match the data B one cycle back, nor does it match the data C two cycles back. This indicates the case where the signal has remained unchanged in the preceding two cycles but changes in the present cycle.

In each of the cycles (iii) and (iv), the enable signal -EN1 is 0, but the enable signal -EN2 is 1; in this case, the parallel driver 32 is driven but the parallel driver 33 is not driven, thus limiting the driving power to twice the normal level.

The cycles (iii) and (iv) each show the case where the present data OT does not match the data B one cycle back, but matches the data C two cycles back. That is, changes occur in succession.

The present invention can also be viewed as providing a method of signal transmission between a driver and a receiver.

That is, the present invention provides a method for transmitting a transmit signal by obtaining the driver output as the transmit signal by using the driver circuit and the driver driving method described above, wherein the input data to the driver is compared with the data one cycle back, and if they are not identical, the driving power of the driver is increased to produce an output signal which is transmitted as the transmit signal.

Further, according to the transmission method of the present invention, the input data is further compared with the data two cycles back, and if they are identical, the factor by which to increase the driving power of the driver is reduced to produce an output signal which can then be transmitted as the transmit signal by suppressing perturbations in its waveform.

Furthermore, the increase of the driving power of the driver used in the transmission method of the present invention, and the reduction of the factor by which to increase the driving power, can be accomplished by operating a prescribed number of drivers selected from among three or more drivers connected in parallel.

Figure 6:
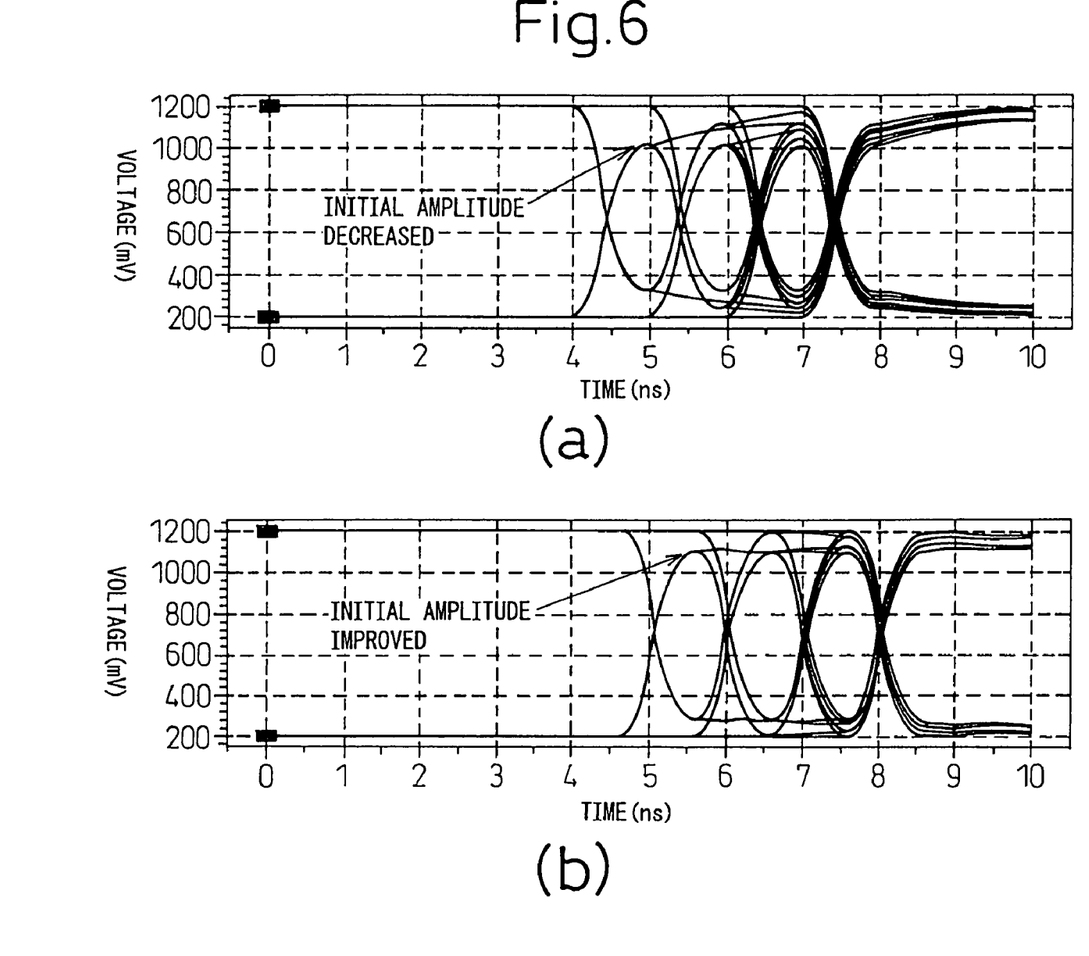
FIG. 6 is a set of waveform diagrams showing simulation results for the first embodiment for comparison with a reference example.
Figure 7:
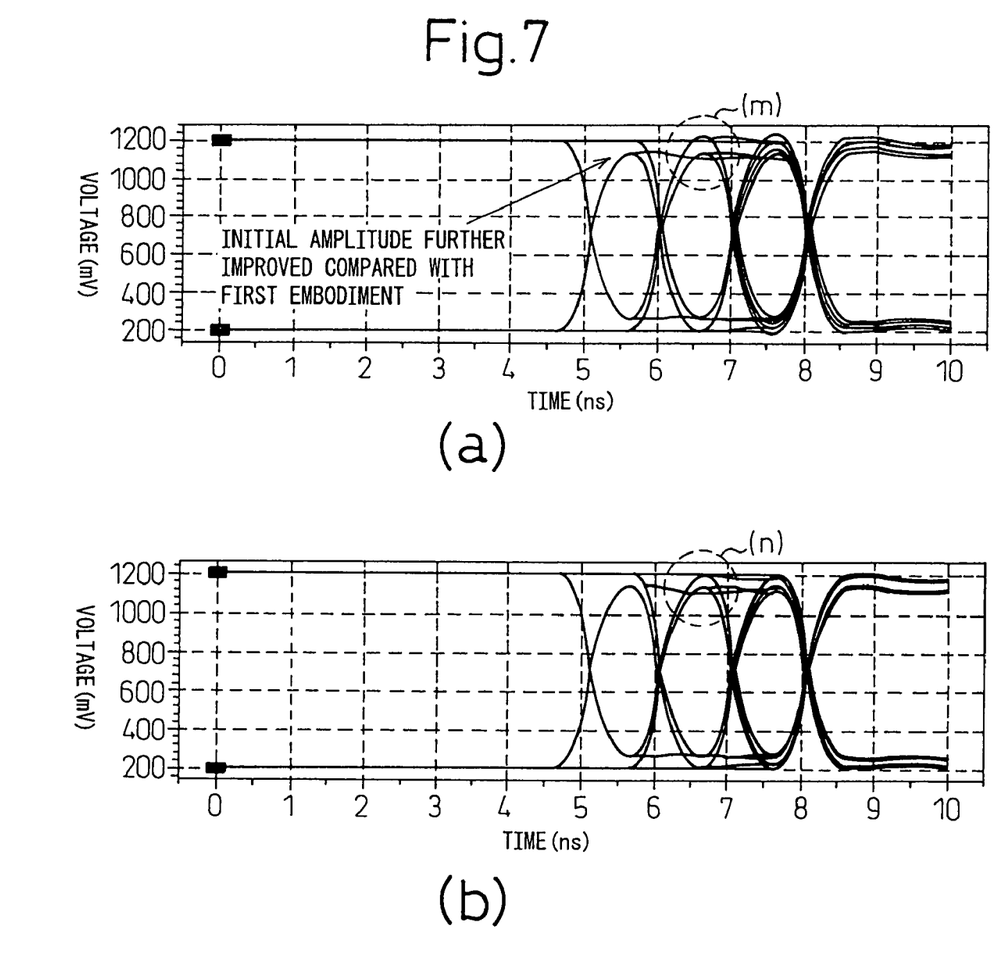
FIG. 7 is a set of diagrams showing simulation results for the second and third embodiments.

FIGS. 6 and 7 are waveform diagrams showing the results of the simulation performed of the embodiments of the present invention to demonstrate the advantageous effects of the present invention.

Each diagram was constructed by sequentially inputting 16 four-bit combinations 0000 to 1111 as input signals and by overlaying the obtained waveforms. The observation point indicated by Rv is the point at which the transmitted signal, having passed through the transmission line, enters the receiver.

In this simulation, the length of the transmission line was set to 45 cm; in each diagram, the ordinate represents the voltage plotted with 200 mV/div. and the abscissa represents the time plotted with 1 ns/div.

FIG. 6(a) shows a reference example in which the present invention is not used. The circuit is fundamentally the same as that of the first embodiment shown in FIG. 2(a), except that the parallel driver 32 is omitted and the FF 12 and ENOR 21 constituting the driver control unit are removed.

In the reference example, the initial amplitude of the rising and falling portions from 0 to 1 and from 1 to 0 is decreased.

In contrast, in the simulation result of the first embodiment shown in FIG. 6(b), it can be seen that the initial amplitude is clearly improved.

FIG. 7(a) shows the simulation result of the second embodiment; as can be seen, the initial amplitude is further improved compared with the first embodiment.

FIG. 7(b) shows the simulation result of the third embodiment; here, the same effect as achieved in the second embodiment in improving the initial amplitude is obtained, and in addition to that, fluctuations in the waveform in the horizontal and vertical directions are reduced compared with the second embodiment. For example, (m) in the second embodiment indicates the last 1 in a code sequence changing from 1 to 0 and to 1, and is emphasized by three times; as can be seen, it overshoots the steady-state level. In contrast, in the third embodiment, the overshoot is eliminated as shown in (n). This is because, for the last 1 in the above code sequence, the driving power is not increased by three times but is limited to twice the normal level.

In this way, when changes occur in succession, better loss compensation can be achieved by making the compensation after referring not only to the data one cycle back but also to the data two cycles back.

In the driver circuit and the driver driving method according to the present invention, as the driving power of the driver is increased to compensate for the high frequency transmission loss of the signal, the driver circuit capable of compensating for the transmission loss can be constructed using simple circuitry.

Furthermore, as the factor by which to increase the driving power of the driver is controlled by referring to not only the signal one cycle before the driver input signal but also the signal two cycles before the input signal, a driver output compensated for the transmission loss and less prone to waveform perturbations can be obtained.

On the other hand, according to the control circuit of the present invention, the driver circuit can be controlled according to the variation of the input signal to the driver circuit (for example, the variation of the input signal over time).

Further, by transmitting the output of the driver circuit, a transmission method less susceptible to transmission loss can be achieved.

What is claimed is:

1. A driving method for emphasizing edges of a signal output from a driver, comprising:
    comparing an input signal data to said driver with data one cycle back;
    increasing driving power of said driver if they are not identical;
    comparing said input signal data with data two cycles back; and
    reducing the increased driving power to a predetermined level if they are identical.

2. A driver driving method as claimed in claim 1, wherein increasing or reducing the driving power of said driver comprises actuating a predetermined number of drivers selected from among three or more drivers connected in parallel.

3. A driver circuit for emphasizing edges of an output signal comprising:
    a driver control unit for comparing input signal data with data one cycle back, and generating a driver control signal to increase driving power of said driver circuit when the input signal data is not identical to the data one cycle back; and
    a driver unit for generating an increased output signal by input of said driver control signal,
    wherein said driver control unit further compares said input signal data with data two cycles back, and generates the driver control signal to reduce said increased driving power of the driver unit to a predetermined level when the input signal data is identical to the data two cycles back.

4. A driver circuit as claimed in claim 3, wherein said driver unit includes three or more drivers, and a predetermined number of drivers are actuated by said driver control signal to said driver unit.

5. A driver circuit as claimed in claim 4, wherein said driver unit has a plurality of drivers connected in parallel, and the increase of the driving power of said driver is accomplished by operating said plurality of drivers connected in parallel.

6. A transmission method comprising:
    transmitting an output signal of a driver to a receiver;
    comparing an input signal data to said driver with data one cycle back; and
    increasing a driving power of said driver and transmitting the output signal produced by said driver with said increased driving power when the input signal data to said driver is not identical to the data one cycle back,
    wherein said input signal data is compared with data two cycles back, and if they are identical, the factor by which to increase said driving power is reduced.

7. A transmission method as claimed in claim 6, wherein the increase of the driving power of said driver and the reduction of said factor are accomplished by operating a prescribed number of drivers selected from among a plurality of drivers connected in parallel.

* * * * *